United States Patent [19]

Venkataraman et al.

[11] 4,274,909
[45] Jun. 23, 1981

[54] METHOD FOR FORMING ULTRA FINE DEEP DIELECTRIC ISOLATION

[75] Inventors: Krishnamur Venkataraman; Bob H. Yun, both of Hopewell Junction, N.Y.

[73] Assignee: International Business Machines Corporation, Armonk, N.Y.

[21] Appl. No.: 130,882

[22] Filed: Mar. 17, 1980

[51] Int. Cl.³ .................... H01L 21/20; H01L 21/22; H01L 21/308
[52] U.S. Cl. .................................... 156/648; 29/571; 29/576 W; 29/578; 148/1.5; 148/187; 156/653; 156/657; 156/659.1; 156/662
[58] Field of Search ............... 156/636, 643, 644, 652, 156/653, 657, 659.1, 662, 661, 668, 648, 649; 148/174, 175, 187, 1.5; 29/576 W, 578, 571; 357/48, 49; 427/93, 94, 399

[56] References Cited

U.S. PATENT DOCUMENTS

| | | | |
|---|---|---|---|
| 3,534,234 | 10/1970 | Clevenger | 148/175 |
| 3,648,125 | 3/1972 | Peltzer | 357/50 |
| 3,725,160 | 4/1973 | Bean et al. | 156/647 |
| 3,892,608 | 7/1975 | Kuhn | 148/175 |
| 3,920,483 | 11/1975 | Johnson et al. | 156/643 |
| 3,956,033 | 5/1976 | Roberson | 148/175 |
| 3,966,577 | 6/1976 | Hochberg | 29/578 |
| 3,969,168 | 7/1976 | Kuhn | 357/49 |
| 3,970,486 | 7/1976 | Kooi | 148/187 |
| 3,979,237 | 9/1976 | Morcom et al. | 156/657 |
| 3,979,765 | 9/1976 | Brand | 357/23 |
| 3,997,378 | 12/1976 | Kaji et al. | 29/578 |
| 4,025,411 | 5/1977 | Hom-ma et al. | 156/643 |
| 4,037,307 | 7/1977 | Smith | 29/571 |
| 4,042,726 | 8/1977 | Kaji et al. | 156/648 |
| 4,083,098 | 4/1978 | Nicholas | 29/578 |
| 4,093,503 | 6/1978 | Harris et al. | 156/643 |
| 4,104,086 | 8/1978 | Bondur et al. | 148/1.5 |
| 4,209,350 | 6/1980 | Ho et al. | 156/657 |
| 4,211,582 | 7/1980 | Horng et al. | 156/657 |

OTHER PUBLICATIONS

Abbas, "Recessed Oxide Isolation Process" IBM Technical Disclosure Bulletin, vol. 20, No. 1 (6/77) pp. 144-145.

Pogge, "Narrow Line ... Method" IBM Technical Disclosure Bulletin, vol. 19, No. 6 (11/76) pp. 2057-2058.

Abbas et al., "Extending ... Processing" IBM Technical Disclosure Bulletin, vol. 20, No. 4 (9/77) pp. 1376-1378.

Anastasio et al., "Dielectric ... Etching (DIVE)" Extended Abstracts, vol. 78-2, No. 180, pp. 482-483.

Chang, "Method for ... Structures" IBM Technical Disclosure Bulletin, vol. 22, No. 2 (7/79) p. 543-544.

Ho et al., "Self-Aligned ... Contact" IBM Technical Disclosure Bulletin, vol. 22, No. 12 (5/80) pp. 5336-5338.

Deines et al., "Process for ... Geometries" IBM Technical Disclosure Bulletin, vol. 21, No. 8 (2/79) pp. 3628-3629.

Geffken et al., "Self-Aligned ... Process" IBM Technical Disclosure Bulletin, vol. 21, No. 4 (9/78) pp. 1367-1369.

*Primary Examiner*—Jerome W. Massie
*Attorney, Agent, or Firm*—George O. Saile

[57] ABSTRACT

A method is shown for forming ultra fine, deep dielectric isolation in a silicon body. The method involves forming a first layer of material on the silicon body over a first set of alternately designated device regions. A conformal coating is deposited over the first layer and on the silicon body included in a second set of alternately designated device regions and the designated isolation regions. The thickness of the conformal coating is chosen to be substantially the width of the planned isolation between device regions. A second layer is then deposited over the conformal coating. The first layer and conformal coating are composed of different materials. The topmost surface comprising of the second layer and the conformal coating is planarized by removing partially the second layer and conformal coating from the first layer wherein the second set of alternately designated device regions in the silicon body are covered by the conformal coating and the second layer with portions of the conformal coating separating the covers for the first and second set of device regions.

The portions of the conformal coating separating the covers are removed down to the silicon body over the designated isolation regions. A groove is then etched in the silicon body using the covers as the etch mask. The groove is etched to the desired depth of the dielectric isolation in the designated isolation regions and then is filled typically by thermal oxidation.

18 Claims, 6 Drawing Figures

METHOD FOR FORMING ULTRA FINE DEEP DIELECTRIC ISOLATION

DESCRIPTION

1. Technical Field

The invention relates to methods for dielectrically isolating regions of monocrystalline silicon from other regions of monocrystalline silicon, and more particularly to the formation of ultra fine widths of such isolation without the use of nonlight lithography techniques.

2. Background Art

In the monolithic integrated circuit technology whether for bipolar, field effect or similar devices, it is usually necessary to isolate various active and/or passive elements from one another in the integrated circuit structure. These devices have been isolated by backbiasing PN junctions, partial dielectric isolation and complete dielectric isolation. The dielectric materials used have been silicon dioxide, glass, and so forth. The preferred isolation for these active devices and circuits is some form of dielectric isolation in the highly dense integrated circuit technology. The dielectric isolation has the substantial advantage over the PN junction isolation because it allows the butting of the circuit elements against the isolation and thereby results in greater density of packing of the active and passive devices on the integrated circuit chip.

One form of dielectric isolation involves the formation of grooves or depressions in silicon where the isolation regions are to be formed. During the groove formation, the remainder of the silicon surface is protected by a protective film which is substantially unaffected by the silicon etch used to form the grooves. The usual protective layer is a silicon nitride, silicon dioxide sandwich layer. Following the formation of the grooves by conventional chemical etching, the silicon body is subjected to a conventional oxidation step whereby the silicon in the groove area is oxidized and the silicon dioxide fills up the groove as well as oxidizing further into the silicon to form the isolation region. This process is described more fully by E. Kooi U.S. Pat. No. 3,970,486, Clevenger U.S. Pat. No. 3,534,234, Peltzer U.S. Pat. No. 3,648,125 and I. Magdo et al., patent application Ser. No. 150,609, filed June 7, 1971.

The formation of grooves and the filling of such grooves for isolation purposes have been described by other publications such as the G. L. Kuhn, U.S. Pat. Nos. 3,892,608 and 3,969,168. In these patents, chemical etching is used to form a V groove, a rounded bottom groove or a rectangular evacuated space. There is little detail as to how the groove is formed but it is clear that the groove would be limited by the nature of the chemical etching step. The process does not necessarily yield a planar surface and it requires photolighography after the formation of the grooves. D. K. Roberson U.S. Pat. No. 3,956,033 describes a similar chemical etch followed by filling with polycrystalline silicon. Here again, the groove is limited by the chemical etching technique and it is unclear how the overgrowth of the polysilicon is removed. K. E. Bean et al. U.S. Pat. No. 3,725,160 and W. R. Morcom et al. U.S. Pat. No. 3,979,237 also show filling of grooves. In these patents, the effect of chemical etching is more clearly brought out where it is shown that monocrystalline silicon are preferentially etched chemically to provide grooves having symmetrical sidewalls sloped at precise angles depending upon the particular face crystal to which the silicon surface is aligned.

The Brand U.S. Pat. No. 3,979,765 also describes the chemical etching to open rectangular grooves and the filling of the grooves with insulator material. However, it is difficult to understand how some of the principal steps such as etching and filling are actually effected from the description.

The formation of rectangular grooves have been made in the Hochberg U.S. Pat. No. 3,966,577 and T. Kaji et al. U.S. Pat. No. 3,997,378 and S. A. Abbas, IBM TDB Vol. 20, No. 1, p. 144, June 1977 entitled "Recessed Oxide Isolation Process", and J. A. Bondur et al. U.S. Pat. No. 4,104,086.

An effective technique for accomplishing the formation of ultra fine grooves that can be then filled with dielectric material to act as dielectric isolation for highly dense integrated circuit devices has not been available. There have been other efforts to obtain narrow line widths in the range of 1 micrometer or less by extending standard photolithography techniques and avoiding the need to use the more expensive and complex techniques such as electron beam or X-ray lithography. One such technique is described by H. B. Pogge in IBM TDB, Vol. 6, November 1976, entitled "Narrow Line Widths Masking Method". This method involves the use of a porous silicon followed by oxidation of the porous silicon. The resulting structure may be used for the etching of narrow grooves into the surface of the silicon body for device isolation purposes. Another technique is described by S. A. Abbas et al., IBM TDB, Vol. 20, No. 4, September 1977, pp. 1376–1378. This TDB describes the use of polycrystalline silicon masking layers which are made into masks by first using an intermediate mask of oxidation blocking material, such as silicon nitride in the formation of the polycrystalline silicon. Line dimensions below about 2 micrometers may be obtained by this technique. M. M. Anastasio et al., "Dielectric Isolation Using Vertical Etching (DIVE)" Extended Abstracts, Vol. 78-2, No. 180, pp. 482,483 Fall Meeting The Electro Chemical Soc., Oct. 15-20, 1978 describes the formation of narrow grooves by a somewhat complex process for dielectric isolation purposes.

SUMMARY OF THE INVENTION

In accordance with the present invention, a method is described for the formation of ultra fine grooves that can be filled with dielectric material which can then act as dielectric isolation for highly dense integrated circuit devices. This method is accomplished by first forming a first layer of material on the silicon body wherein the dielectric isolation is desired. The layer material is formed over a first set of alternately designated device regions with bare silicon therebetween. A conformal coating is deposited over the first layer and on the silicon body included in a second set of alternately designated device regions and the designated isolation regions. The thickness of the coating is made to be substantially the width of the planned dielectric isolation. A second layer is then deposited over the conformal coating. The first layer and the conformal coating are composed of different materials. The topmost surface of the second layer and the conformal coating are planarized by removing partially the second layer and conformal coating from the first layer wherein the second set of alternately designated device regions in the silicon body are covered by the conformal coating and the second layer with portions of the conformal coating separating the covers for the first and second sets of device regions. The vertical portions of the conformal coating separating the covers are then removed down to the silicon body in the designated isolation regions. These covers are then used as an etch mask for a etching of grooves in the silicon body to the desired depth of the dielectric isolation. The grooves are then filled with dielectric material to form the dielectric isolation. The preferred method of filling the grooves is by a thermal oxidation process.

DISCLOSURE OF THE INVENTION

Referring now particularly to FIGS. 1 through 6, the manufacturing steps for the ultra fine dielectric isolation of one form of the invention are shown. The form of the invention chosen here for illustration is the fabrication of integrated bipolar circuits on silicon chips. Another form, such as the formation of channel stoppers in charge coupled device (CCD) arrays could have been chosen for illustration. The structure of FIG. 1 includes the monocrystalline silicon substrate 10 which is shown as P− conductivity for illustration purposes, an N+ layer 12 over the substrate 10 and an N-conductivity layer 14 on the layer 12. For the purposes of the invention, either all or some of the layers 10, 12 and 14 could be of opposite conductivity from the conductivity types indicated. However, it is preferred to have the layer 12 to be a high conductivity region, since it will ultimately be the sub-collector of a bipolar transistor. This structure can be fabricated by various techniques. However, the preferred technique is to provide a P− monocrystalline silicon substrate and to diffuse an N+ blanket diffusion into the substrate by using conventional diffusion or ion implantation of an N type impurity such as arsenic, antimony or phosphorus to produce an N+ region with a surface concentration of between about $1 \times 10^{19}$ or $1 \times 10^{21}$ atoms/cc. The layer 14 is subsequently grown onto the 10, 12 structure by means of epitaxial growth. This may be done by conventional techniques such as the use of arsine in $SiCl_4/H_2$ or $SiH_4/H_2$ mixtures at growth temperatures of about 1000° C. to 1200° C. The N+ layer may have a typical thickness of between about 1–3 microns whereas the epitaxial layer has a thickness of from 0.5 to 10 microns, the exact thicknesses depending upon the device to be built.

Alternatively the structure could be made by various combinations of thermal diffusion, ion implantation and/or epitaxial growth which would include the formation of a varied subcollector region where subsequent formation of bipolar devices is desired.

In certain device structures, buried highly doped regions or layers are not necessary and can therefore be omitted. This would be true for FET type devices. Alternatively, multiple buried highly doped regions of different dopant types could be formed by multiple epitaxial and diffusion processing. These structures could be needed for buried subcollector, as well as buried conductor lines.

Figure 1:
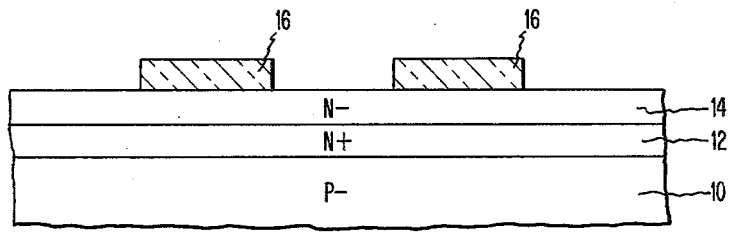
FIGS. 1-6 illustrate one method for forming dielectric isolated structure of the invention.

A first layer 16 of material, such as silicon nitride or a polycrystalline silicon is deposited over the silicon body, 10, 12 and 14. The layer 16 is then patterned by conventional lithography and etching techniques so as to form the first layer of material 16 over a first set of alternately designated device regions as shown in FIG. 1. Where the material 16 is silicon nitride, it may be deposited by any of the conventional methods for depositing silicon nitride. One of the common methods for depositing silicon nitride is by chemical vapor deposition using the following process conditions: $SiH_4$, $NH_3$ and $N_2$ carrier gas at a temperature of about 800° C. under atmospheric or low pressure conditions as discussed in the V. Y. Doo U.S. Pat. No. 4,089,992. Where silicon nitride is used it is often preferred to first deposit a thin silicon dioxide layer (not shown) known as pad oxide underneath the silicon nitride layer to reduce potential stress in the silicon body. Where the material chosen for the first layer is polycrystalline silicon N or P doped polycrystalline silicon may be deposited over the entire wafer by using a mixture of silane with a suitable N or P dopant in gaseous form in a hydrogen ambient in the temperature range of 500° to 1000° C. Alternately, the polycrystalline silicon can be deposited without doping and then doped if desired by an ion implantation process. The preferred thickness of the first layer is between about 2,000 to 10,000 Å and it is preferred to have a thickness of about 5,000 Å.

The etching of the layer 16 to form the FIG. 1 structure is preferably by a reactive ion or plasma etching technique so as to produce substantially vertical sidewall stripes of first layer 16 as shown in FIG. 1 structure.

Figure 2:
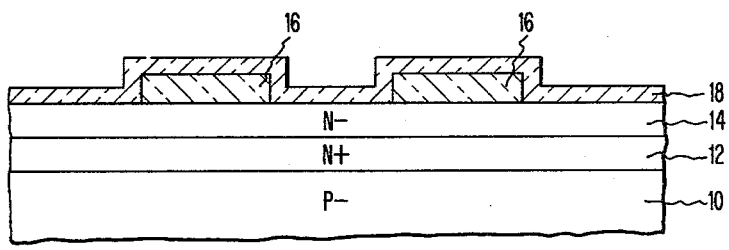
Figure 3:
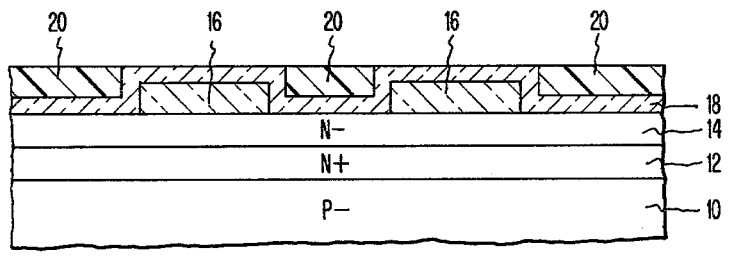

A conformal coating 18 is deposited on both the substantially horizontal surfaces and substantially vertical surfaces of the first layer 16 as well as on the bare surface regions of the silicon body 10, 12 and 14. The bare surface regions of the silicon body includes a second set of alternately designated device regions as well as the designated isolation regions between the designated device regions. This conformal coating can be any one of several materials which includes silicon dioxide, aluminum oxide and combinations of these materials. It is preferred that the coating be silicon dioxide. The silicon dioxide may be deposited by a chemical vapor deposition process wherein silane and oxygen gas at about 450° C. is used or silicon hydrogen chloride ($SiH_2Cl_2$) and $N_2O$ is used at a temperature of about 800° C. under atmospheric or low pressure conditions. FIG. 2 shows the result of this step. The thickness of the conformal coating 18 is chosen as the thickness of the ultimate dielectric isolation. The thickness of the conformal coating is between about 1,000 to 10,000 Å and preferably 2,000 Å.

Figure 4:
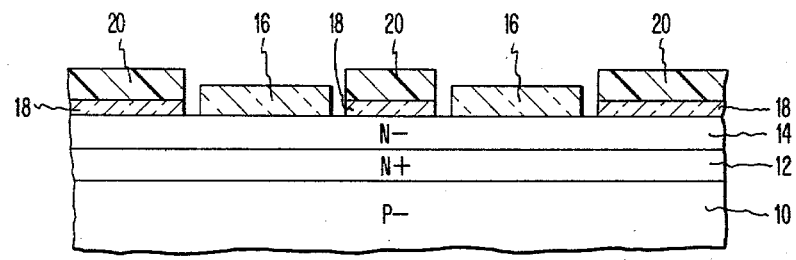

A second layer 20 is now deposited over the surface of the structure. This material may be a plastic material such as a photoresist which may be spin coated over the structure. The surface is then planarized by first removing a portion of the second layer of plastic material such as by the plasma ashing technique in an oxygen ambient. The ashing process is continued until the higher regions of the conformal coating 18 are exposed as shown in the resulting FIG. 3 structure. A further planarization may be accomplished if desired by reactive ion etching both the second layer plastic material and the conformal coating until the first layer 16 is reached. The remaining conformal coating 18 between the covers of the first and second set of device regions may now be removed by a buffered hydrofluoric acid etchant wherein the conformal coating is silicon dioxide. The result of this process is shown in FIG. 4. The buffered hydrofluoric acid is highly selective to silicon dioxide and not to the plastic material 20 or the silicon nitride material 16.

Figure 5:
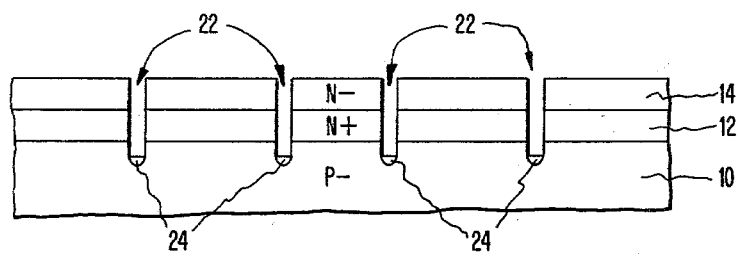

A reactive ion etch is now done which is anisotropic for monocrystalline silicon. The etching process is utilized to form the vertical sidewalls of a groove or trench 22. One preferred etchant is that shown in the L. E. Forget et al. U.S. patent application, Ser. No. 013,696, filed Feb. 21, 1979 which describes an etching gas or sulfur hexafluoride and chlorine diluted with an inert gas. The silicon etching utilizes the mask structure formed and shown in FIG. 4. The reactive ion etching process preferably continues until the etching of groove extends into the P— substrate 10 as shown in FIG. 5. A P+ ion implantation of for example boron is accomplished to produce regions 24 at the bottom of the grooves. This P+ region 24 prevents the possibility of a leakage path around the dielectric isolation from one device region to another. FIG. 5 shows the resulting structure after the etching of the plastic second layer 20, first layer of silicon nitride 16 and the conformal coating layer 18. Where a thin pad oxide is used between the N— layer and layer 16, it can be removed with buffered hydrofluoric acid.

Figure 6:
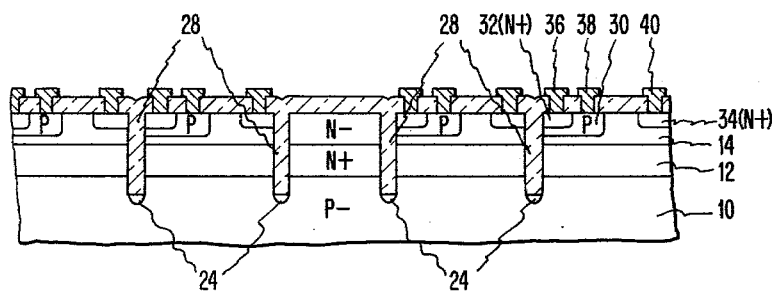

The FIG. 5 structure is then subjected to a thermal oxidation process involving, for example, an oxygen ambient at above about 900° C. for a time sufficient to thermally oxidize the grooves 22 thereby forming the dielectric isolation filled grooves 28. The surface of the silicon body is also thermally oxidized during this groove oxidation. Bipolar semiconductor devices comprising base diffusion 30, emitter diffusion 32 and collector reach through diffusion 34 are made by conventional ion implantation or diffusion techniques as is understood by the art. Contact openings are made to the bipolar device region and a suitable contact metallurgy is blanket deposited over the surface, delineated by lithography and etching techniques to form the emitter contact 36, base contact 38 and collector contact 40 as shown in FIG. 6.

While the invention has been particularly shown and described with reference to the preferred embodiments thereof, it will be understood by those skilled in the art that various changes in form and detail may be made therein without departing from the spirit and scope of the invention. For example, dielectric isolation of numerous types of devices, such as field effect transistor, charge coupled device (CCD), Schottky device, resistor, etc. can be accomplished by the present method. In fact, this invention is well suited for forming ultra fine channel stoppers in CCD arrays.

We claim:

1. A method for making fine, deep dielectric isolation in a silicon body comprising:

forming a patterned first layer of material on said body over a first set of alternately designated device regions;

depositing a uniform thickness, continuous conformal coating over said layer and on said body in a second set of alternately designated device regions and the designated isolation regions separating said alternately designated first and second device regions;

said coating having a thickness which is less than the thickness of said first layer and is substantially the planned width of said isolation;

depositing a second layer over the entire surface of said conformal coating;

the said first layer and said conformal coating are composed of different materials and said first and second layers are composed of different materials;

planarizing the surface by removing said second layer and conformal coating from said first layer and said designated isolation regions above the level of the first layer wherein said second set of alternately designated device regions in said body are covered by said conformal coating and said second layer with portions of said conformal coating below the level of the first layer exposed;

removing the exposed portions of said conformal coating to expose said designated isolation regions on said silicon body;

anisotropically etching a groove in said silicon body at the exposed regions, using said remaining conformal coating and first layer as an etch mask, to the desired depth of the said dielectric isolation in said designated isolation regions; and filling the said groove with dielectric material to form said deep dielectric isolation.

2. The method of claim 1 wherein said silicon body contains a layer of highly doped silicon and said groove extends through said layer.

3. The method of claim 2 wherein said highly doped layer is within said silicon body.

4. The method of claim 3 wherein said layer is N+, said body is P and a P+ implant is made at the bottom of said groove prior to said filling the groove with dielectric material.

5. The method of claim 1 wherein said first layer is silicon nitride, the conformal coating is silicon dioxide and said second layer is a plastic material.

6. The method of claims 1 and 5 wherein the thickness of said conformal coating is between about 1,000 to 10,000 Angstroms.

7. The method of claim 5 wherein there is a thin silicon dioxide layer formed under said silicon nitride first layer.

8. The method of claim 5 wherein the said plastic material is spin coated onto said conformal coating and the surface is planarized by first removing a portion of the said plastic material by ashing until the higher regions of said conformal coating are reached and then reactive ion etching the said plastic material and said conformal coating until the said silicon nitride first layer is reached.

9. The method of claim 8 wherein the remaining said conformal coating in the said designated isolation regions is removed by a buffered hydrofluoric acid etchant.

10. The method of claim 1 wherein said groove is filled by thermal oxidation of the said silicon body in the region of said groove to silicon dioxide.

11. A method for making a highly dense integrated circuit structure having fine, deep dielectric isolation in a silicon body between devices regions comprising:

forming a patterned first layer of material on said body over a first set of alternately designated device regions;

depositing a uniform thickness, continuous conformal coating over said layer and on said body in a second set of alternately designated device regions and the designated isolation regions separating said alternately designated first and second device regions;

said coating having a thickness which is less than the thickness of said first layer and is substantially the planned width of said isolation;

depositing a second layer over the entire surface of said conformal coating;

the said first layer and said conformal coating are composed of different materials and said first and second layers are composed of different materials;

planarizing the surface by removing said second layer and conformal coating from said first layer and said designated isolation regions above the level of the first layer wherein said second set of alternately designated device regions in said body are covered by said conformal coating and said second layer with portions of said conformal coating below the level of the first layer exposed;

removing the exposed portions of said conformal coating to expose said designated isolation regions on the silicon body;

anisotropically etching a groove in said silicon body at the exposed regions, using said remaining conformal coating and first layer as an etch mask, to the desired depth of the said dielectric isolation in said designated isolation regions;

filling the said groove with dielectric material to form said deep dielectric isolation; and forming semiconductor devices in said designated device regions.

12. The method of claim 11 wherein said silicon body contains a layer of highly doped silicon within said silicon body.

13. The method of claim 1 wherein said layer is N+, said body is P, and a P+ implant is made at the bottom of said groove prior to said filling the groove with dielectric material and at least some of said devices are bipolar transistors.

14. The method of claim 11 wherein said first layer is silicon nitride, the conformal coating is silicon dioxide, the second layer is a plastic material and said conformal coating is between about 1,000 to 10,000 Angstroms in thickness.

15. The method of claim 14 wherein the said plastic material is spin coated onto said conformal coating and the surface is planarized by first removing a portion of the said plastic material by ashing until the higher regions of said conformal coating are reached and then reactive ion etching the said plastic material and said conformal coating until the said silicon nitride first layer is reached.

16. The method of claim 15 wherein the remaining said conformal coating in the said designated isolation regions is removed by a buffer hydrofluoric acid etchant.

17. The method of claim 11 wherein said groove is filled by thermal oxidation of the said silicon body in the region of said groove to silicon dioxide.

18. The method of claim 11 wherein field effect transistor devices are located in at least some of said device regions.

* * * * *